_United States Patent_ [19]

de Waard

[11] 4,375,686

[45] Mar. 1, 1983

[54] SEMICONDUCTOR LASER

[75] Inventor: Peter J. de Waard, Eindoven, Netherlands

[73] Assignee: U.S. Philips Corporation, New York, N.Y.

[21] Appl. No.: 212,376

[22] Filed: Dec. 3, 1980

[30] Foreign Application Priority Data

Dec. 13, 1979 [NL] Netherlands .......................... 7908969

[51] Int. Cl.³ ............................................. H01S 3/19
[52] U.S. Cl. ........................................ 372/45; 357/17
[58] Field of Search ................ 372/46, 45, 50; 357/17

[56] References Cited

FOREIGN PATENT DOCUMENTS 2033647 5/1980 United Kingdom .................. 372/46

OTHER PUBLICATIONS de Waard, "A Novel Single Mode Laser having Periodic Variations in the Stripe Width, 'Super DFB', ".

Primary Examiner—James W. Davie
Attorney, Agent, or Firm—Thomas A. Briody; Robert T. Mayer; Steven R. Biren

[57] ABSTRACT

A semiconductor laser includes an active layer of a first conductivity type comprising a strip-shaped active region formed by a doping of the second conductivity type over at least a part of the thickness of the active layer. According to the invention, the active region consists of a number of zones of the second conductivity type which are separated by material of the first conductivity type and which, viewed in the longitudinal direction of the active region, have a maximum dimension of at most 20 μm. Upon ageing, crystal defects in the zones will not expand beyond the zones, thus extending the usable lifetime of the laser.

14 Claims, 8 Drawing Figures

SEMICONDUCTOR LASER

BACKGROUND OF THE INVENTION

The invention relates to a semiconductor laser having a semiconductor body comprising a strip-shaped active region situated within a resonator, in which the radiation is emitted in the longitudinal direction of the strip-shaped active region and in which a number of parallel-arranged p-n junctions are present to inject charge carriers into the active region.

A semiconductor laser of the kind described is known from U.S. Pat. No. 3,510,795.

Semiconductor lasers having a strip-shaped active region are frequently used nowadays, usually in the form of lasers having a single or a double hetero junction (DH lasers) as described, for example, in Philips Technical Review, Vol. 36, No. 7, 1976, pp. 190-200. These lasers comprise an active layer which on at least one side adjoins a passive layer having a larger band spacing, in which active layer the radiation is generated.

In these lasers, ageing phenomena occur in the course of their lives, which are expressed inter alia in the increase of the threshold current, that is to say, the minimum current strength at which stimulated radiation emission occurs, and in the occurence of spontaneous oscillations and pulsations, respectively, in the intensity of the emitted radiation.

It has been found that the occurence of such spontaneous oscillations is often associated with the formation, in the strip-shaped active region of the active layer, of regions having locally increased non-radiating recombinations of charge carriers and increased damping resulting therefrom. As a result of the increased nonradiating recombination, a local rise in temperature occurs so that the band spacing is slightly reduced. This in turn again leads to larger damping. These locally occuring regions often prove to be agglomerations of crystal lattice defects which have a tendency to expand, during the life of the laser, over the whole strip-shaped active region so that the laser soon becomes useless. It has been found that lasers having a comparatively very small active volume are less troubled by the occurence of spontaneous oscillations. However, these lasers are often difficult to manufacture.

In the above-mentioned U.S. Pat. No. 3,510,795, a semiconductor laser is described having a strip-shaped active region in which the p-n junction injecting in said region is divided into number of mutually parallel arranged p-n junctions so as to obtain a better cooling.

SUMMARY OF THE INVENTION

One of the objects of the invention is to provide a new semiconductor laser structure in which the effects of the ageing phenomena are reduced at least to a considerable extent.

The invention is inter alia based on the recognition of the fact that it is possible to extend the life of the laser considerably by restricting the region over which the above-mentioned lattice defects can expand.

For that purpose, according to the invention, a semiconductor laser of the kind mentioned above is characterized in that the strip-shaped active region forms part of an active semiconductor layer of a first conductivity type and comprises a number of zones of the second conductivity type within which the radiation is generated, which zones are connected electrically to an electrode provided on a surface of the semiconductor body, in which the part of the active layer of the first conductivity type situated between the zones has a band spacing which is at least equal to that of the zones, and in which, due to the longitudinal direction of the strip-shaped active region, the largest dimension of the zones is at most equal to 20 $\mu$m.

Since the part of the active layer of the first conductivity type situated between the zones of the second conductivity type within which the radiation recombination occurs has a band spacing which is at least equal to that of the zones, this intermediate region is transparent to the generated radiation. Since the above-mentioned crystal lattice defects grow under the influence of nonradiating recombination of charge carriers, this expansion of the lattice defects does not occur in the intermediate region since substantially no recombination takes place there, and the lattice defects are restricted, also upon growing, to the region of the zones of the second conductivity type. In this manner no large cohering region with lattice defects can be formed in the active volume of the laser, so that spontaneous oscillations are avoided.

A further advantage of a semiconductor laser in accordance with the invention is that the first and higher order transverse modes of the radiation emanating from the zones of the second conductivity type have a direction of emanation which encloses an angle with the longitudinal direction of the strip-shaped active region. These modes of radiation hence leave the active region for a considerable part before they can enter a subsequent zone so as to be further amplified. As a result of this, amplification of the fundamental mode ("zero" order) occurs, and discontinuities in the curve of the radiation intensity as a function of the current strength are avoided. For this purpose, however, the zones of the second conductivity type should not be situated too closely together. Therefore their mutual distance is preferably at least substantially equal to their largest dimension in the longitudinal direction of the active region. It is to be noted that where in this application a dimension of a zone of the second conductivity type is mentioned, this is meant to be a dimension in a direction parallel to the active layer and the surface.

The mutual distance of the zones of the second conductivity type should not be so small that the charge carriers of the second conductivity type injected from a zone in the intermediate material of the first conductivity type of the active layer can move into the adjacent zone of the second conductivity type and recombine there.

In order to restrict the size of the continuous regions occupied by grown lattice defects as much as possible, the largest dimension of the zones of the second conductivity type in the longitudinal direction of the active region is preferably at most 10 $\mu$m.

The said zones preferably form part of regions of the second conductivity type which extend from the surface to over at least a part of the thickness of the active layer. Although the zones of the second conductivity type, if desired, can extend over only a part of the thickness of the active layer, they are advantageously provided over the whole thickness of the active layer so as to obtain optimum efficiency. The zones preferably terminate in the immediate proximity of the junction between the active layer and the underlying adjoining passive layer.

The active layer preferably consists of n-type conductive gallium arsenide or gallium aluminum arsenide in which p-type conductive zones are formed by doping with zinc, for example, by diffusion. Since in this case the n-type material has a larger band spacing than the p-type material, the condition for the band spacing is automatically satisfied.

Finally it is of importance to note that, where the resonator is formed by reflected side faces of the semiconductor body, for example, formed by cleavage faces of the crystal, it is of advantage when said reflecting faces intersect the active layer only in the material of the first conductivity type which is transparent to the radiation. In that case no recombination takes place near the reflecting faces so that these faces are less easily damaged. The permitted radiation density of the laser can be increased by approximately a factor 10 relative to the case in which the reflection faces intersect the material of the second conductivity type.

BRIEF DESCRIPTION OF THE DRAWING

The invention will now be described in greater detail with reference to the drawing, in which.

DETAILED DESCRIPTION

Figure 1:
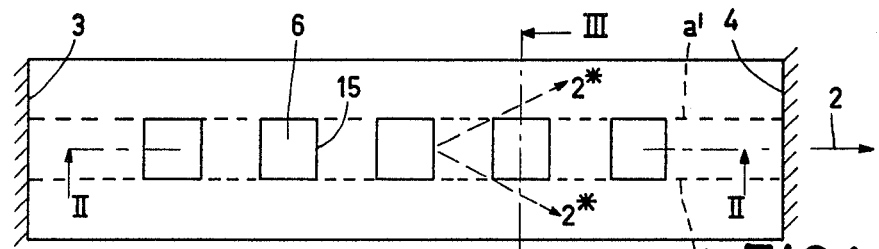
FIG. 1 is a plan view of a semiconductor laser according to the invention.

The figures are diagrammatic and not drawn to scale, as the dimensions in the direction of thickness are exaggerated for clarity. In the cross-sectional views, semiconductor regions of the same conductivity type are shaped in the same direction. Corresponding parts are generally referred to by the same reference numerals in the Figures. FIG. 1 is a diagrammatic plan view and FIGS. 2 and 3 are diagrammatic cross-sectional views taken on the lines II—II and III—III of FIG. 1 of a semiconductor laser according to the invention.

Figure 2:
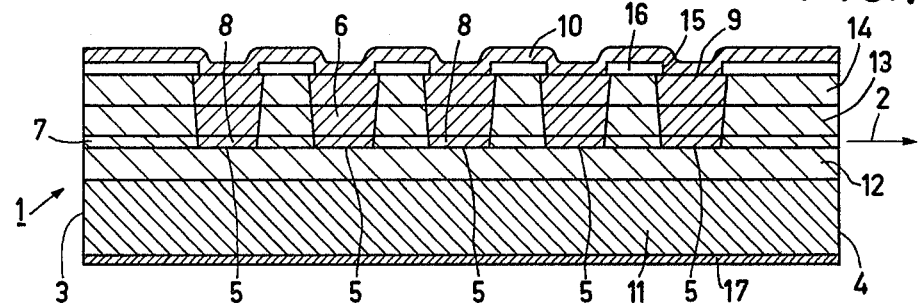
FIG. 2 is a cross-sectional view of the laser shown in FIG. 1 taken on the line II—II.
Figure 3:
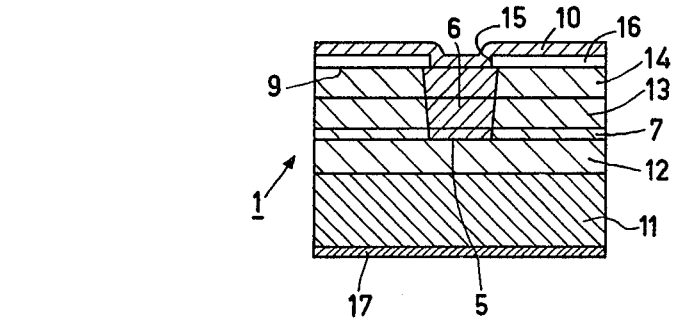
FIG. 3 is a cross-sectional view of the laser shown in FIG. 1 taken on the line III—III.

The semiconductor laser has a semiconductor body 1 with a strip-shaped active region which is situated within a resonator, the boundaries of which are denoted in the plan view of FIG. 1 by a' and in which the laser radiation, denoted in FIGS. 1 and 2 by the arrow 2, is emitted in the longitudinal direction of the strip-shaped active region. In this example the resonator is formed by two reflecting side faces 3 and 4 of the semiconductor body extending substantially perpendicularly to the active region, which side faces usually are faces of the semiconductor crystal. A number of p-n junctions 5 are present to inject charge carriers into the active region; these p-n junctions are formed between the regions 6 and the adjoining part of the semiconductor body to be described hereinafter.

According to the invention the strip-shaped active region forms part of the active semiconductor layer 7 of the first conductivity type, said layer 7 comprising a number of zones 8 of the second opposite conductivity type within which the radiation is generated. Via the above-mentioned regions 6, said zones 8 are connected electrically to an electrode 10 which is provided on a surface 9 of the semiconductor body and which in this case is formed by a metal layer. Furthermore, according to the invention, the part of the active layer 7 of the first conductivity type situated between the zones 8 has a band spacing which is at least equal to that of the zones 8. Finally, according to the invention, the largest dimension of the zones 8, viewed in the longitudinal direction of the strip-shaped active region, is at most equal to (in this example smaller than) 20 $\mu$m.

In this example the semiconductor body is composed of a substrate 11 of n-type conductive gallium arsenide, in a thickness of 100 $\mu$m and a doping concentration of $10^{18}$ silicon atoms per cm$^3$. Provided thereon is a layer 12 of n-type conductive gallium aluminum arsenide of the composition $Ga_{0.65}Al_{0.35}As$, in a thickness of 2 $\mu$m and a doping concentration of $5.10^{17}$ tin atoms per cm$^3$. Present on this layer 12, hereinafter referred to as first passive layer, is the already-mentioned active layer 7 consisting of n-type gallium aluminum arsenide having the composition $Ga_{0.95}Al_{0.05}As$ and a thickness of 0.2 $\mu$m, which layer has a doping concentration of $10^{18}$ tin atoms per cm$^3$. Provided thereon is an n-type conductive second passive layer 13 of gallium aluminium arsenide having the composition $Ga_{0.65}Al_{0.35}As$, a thickness of 1.5 $\mu$m and a doping concentration of $5.10^{17}$ tin atoms per cm$^3$. Present thereon is an n-type contact layer 14 of gallium arsenide in a thickness of 0.3 $\mu$m and a doping concentration of $5.10^{17}$ tin atoms per cm$^3$. The p-type regions (6,8) are obtained by diffusion of zinc via the windows 15 in an electrically insulating mask layer 16, for example of silicon oxide, aluminum oxide, silicon nitride or another dielectric material, provided on the surface 9. On the lower side of the substrate 11 a metal layer 17 is provided; the p-n junctions 5 can be biased in the forward direction by applying a voltage to the metal layer 10 which is positive relative to the metal layer 17. Laser action occurs at a current strength in the forward direction above the threshold current.

In known laser diodes of the double hetero junction type of the kind described, the diffused p-type zone (6,8) would extend as a continuous strip-shaped zone over the whole length of the laser. Crystal lattice defects which are present in that zone give rise to nonradiating recombinations. During operation, in particular during continuous operation of such a laser, these crystal lattice defects extend under the influence of the nonradiating recombinations until the laser starts showing spontaneous oscillations, in addition to an increased threshold voltage, and becomes useless. The crystal defects can grow until they cover the whole zone 8.

In the laser according to the invention, any crystal lattice defect present in any of the zones 8 could at most expand to the volume of this one zone. The intermediate regions of the active layer of the first conductivity type are as a matter of fact transparent to the radiation, so no electron/hole pairs are formed therein and hence no recombination occurs. The zones 8 which contain no crystal defects are therefore not attacked by the growth of the crystal defects in other zones.

It has been found that by using the laser structure according to the invention spontaneous oscillations (with the associated disadvantages) can be avoided. Additional advantages of the laser described are: a better thermal cooling than in known DH lasers, and absence of astigmatism due to the refractive index step in lateral direction, between the zones 8 and the n-type material.

Although for clarity only five zones 8 are shown in the drawing, this number will usually be much larger. In the semiconductor laser of the example described, the number of said zones was actually 25. The zones had dimensions of approximately 6×6 µm; the mutual distance of the zones was also approximately 6 µm and the overall length of the laser was 334 µm. The side faces 3 and 4, as appears from FIGS. 1 and 2, were provided in the n-type part of the layer 7 at a distance of approximately 20 µm from the nearest zone 8. As a result of this, substantially no recombination occurs at the reflection faces 3 and 4 and the radiation intensity at which irreparable damage of said side faces occur is approximately 10 times as high as when the reflection faces 3 and 4 were provided in the p-type region.

The semiconductor laser according to the invention can be manufactured, for example, as follows. Starting material is an n-type substrate 11 of Ga As having a doping concentration of $10^{18}$ silicon atoms/cm$^3$. Grown thereon by epitaxial growth from the liquid phase are successively the layers 12, 7,13 and 14 having the above-mentioned thicknesses and doping concentrations. Growth from the liquid phase is a generally used method in semiconductor technology and the details thereof need not be entered into. Reference is made to the book by D. Elwell and J. J. Scheel, Crystal Growth from High Temperature Solutions, Academic Press 1975, pp. 433-467.

A 0.15 µm thick masking layer 16, in this example of aluminum oxide (Al$_2$O$_3$) is then provided on the surface of the layer 14. This may be done, for example, by vapor deposition. Windows 15 are etched in the layer 16 by means of conventional photo-etching methods. As an etchant may be used concentrated phosphoric acid (H$_3$PO$_4$) at 70° C.

Zinc is then diffused through the windows 15 at 620° C., for example, in an evacuated capsule having ZnAs$_2$ as a diffusion source, the aluminum oxide layer 16 serving as a mask. The duration of the diffusion depends on the thickness of the layers 7, 13 and 14; in the above layer thicknesses given by way of example this time is approximately 90 minutes. P-type regions (6,8) are then obtained which extend approximately down to the interface between the layers 12 and 7.

Another possibility in which the diffusion need not be so deep, so that the lateral diffusion is reduced, is obtained when, prior to the diffusion of the zinc, layer 14 is removed at the area of the windows 15 by means of a selective etchant which does attack GaAs but does not attack gallium aluminum arsenide. Such an etchant is composed, for example, of 25 cm$^3$ of H$_2$O$_2$ 30% and 25 cm$^3$ of water replenished with NH$_4$OH to pH=8.

The metal layers 10 and 17 are then provided, the layer 10 being, for example, a chromium layer and the layer 17 being a gold-germaniumnickel alloy. Finally the laser is mounted on a cooling member in the usual manner, preferably with the metal layer 10, and provided in an envelope.

Instead of by epitaxial growth from the liquid phase, the above-described laser can also be manufactured in a different manner, for example, by epitaxial growth from the gaseous phase. Instead of the semiconductor material used in this example, other semiconductor materials suitable for laser manufacture may also be used.

It is to be noted that although in this example the reflection members are formed by cleavage faces of the semiconductor crystal, other reflection members may also be used. For example, they may also be formed by providing on or near the active region, taken in the longitudinal direction of said region, a geometric periodic change in the index of refraction and/or the layer thicknesses. This is the structure of the distributed feedback lasers (DFB lasers) as they are described, for example, in Applied Physics Letters, Vol. 15, February 1971, pp. 152-154.

For illustration, FIG. 1 furthermore shows diagrammatically the directions $2^x$ in which, for example, the laser radiation of the first order transversal mode generated in the central zone 8 leaves the zone. When, as in this example, the mutual distance of the zones 8, taken in the longitudinal direction of the active region, is at least of the same order as the largest dimension of the zones 8 the greater part of the radiation in the directions $2^x$ does not enter the adjacent zone 8 and is hence not further amplified. This applies to an even more considerable extent for the higher order modes. Since as a result of this the occurence of the first and higher order transversal modes are additionally, a slightly wider strip-shaped active region may in principle be used than is the case in known lasers having a continuous active zone. Conversely it may be said that in the semiconductor laser according to the invention the generation of laser radiation with only one transversal mode of oscillation is stimulated to a considerable extent.

Figure 4:
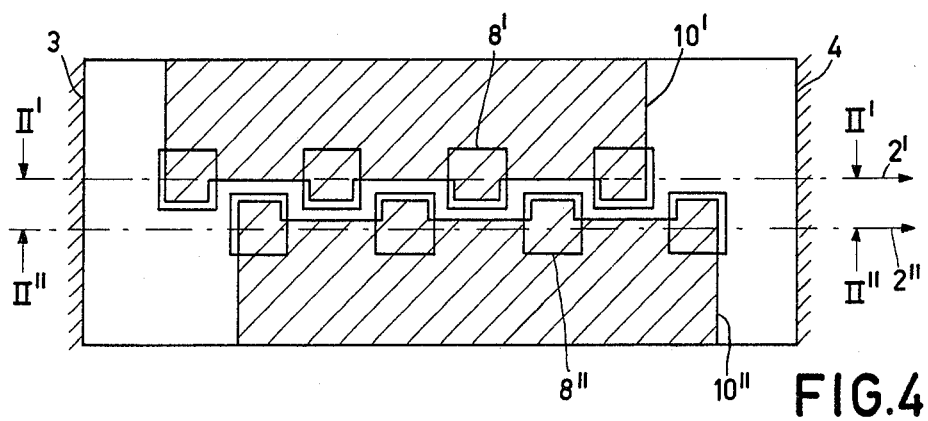
FIG. 4 is a cross-sectional view of another embodiment of the semiconductor laser in accordance with the invention.

As indicated in the example described (see FIG. 1) the zones 8 of the second conductivity type viewed in the longitudinal direction of the active region are advantageously situated with their centers on a single line (II—II) behind each other. In certain circumstances, however, it may be advantageous to have these zones situated with their centers alternately on one of two parallel lines, the distance of these parallel lines being preferably smaller than the dimension of the zones in the direction of the width of the active region. This is of advantage in particular when the zones 8' which are situated on one parallel line II'—II' are connected to a first electrode 10', and the zones 8" which are situated on the other parallel line II"—II" are connected to a second electrode 10", as is shown diagrammatically in the plan view of FIG. 4. As one or the other of the electrodes 10' or 10" is energized relative to the electrode 17, a laser beam 2' or 2" will be generated in which the distance between the emanating regions of these two beams may be very small, and considerably smaller than is possible in known lasers for generating a "movable" laser beam.

Figure 5:
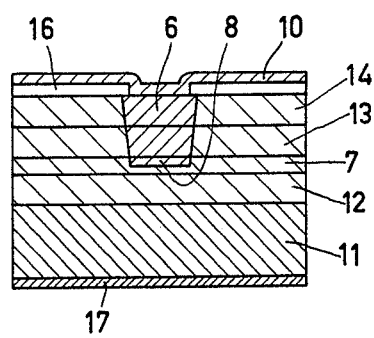
FIG. 5 is a cross-sectional view in the direction III—III through a further embodiment of a laser in accordance with the invention.

The invention is not restricted to the examples described and can be varied in many manners by those skilled in the art. For example, it is not strictly necessary that in the embodiment of FIGS. 1,2 and 3 the p-type regions (6,8) extend over the whole thickness of the active layer 7; in order to achieve the object of the invention it is sufficient in particular when the zones 8 extend over only a part of the thickness of the layer 7, as shown diagrammatically in the cross-sectional view of FIG. 5, in a direction corresponding to the lines III—III of FIG. 1. A deeper zinc diffusion, down to a selected depth in the layer 12, may also be used.

Furthermore it is not necessary to use a double hetero junction laser. In a single hetero junction laser obtained, for example, by manufacturing, in the laser shown in FIGS. 1 to 3, the regions 7 and 12 of a semiconductor material of the same composition the present invention may also be advantageously used.

Figure 6:
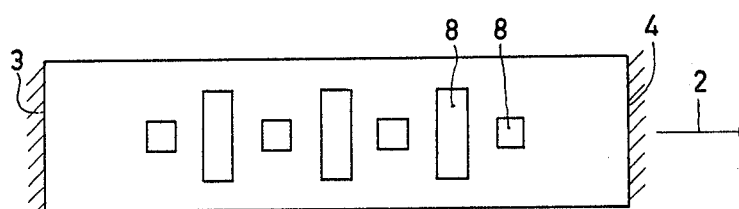
FIGS. 6, 7 and 8 are plan views of still other embodiments of the laser in accordance with the invention.

The dimensions of the zones of the second conductivity type need not all be equal either. In particular, according to the longitudinal direction of the active region, the transverse dimension of the zones may show a (geometric) periodic variation. This is shown diagrammatically in the plan view of FIG. 6. Such a structure shows properties analogous to those of the laser structure having periodic width variation of the strip-shaped active region as described in the previously-filed Netherlands Patent Specification 7900668 of Applicants.

In addition to the semiconductor material of the various layers, the doping materials for the zones 8 may also be varied at will. The various conductivity types may be replaced by their opposite types provided the condition for the band spacings in the active layer is taken into account. For example, in certain circumstances it may occur that instead of the zones 8 the material of the layer 7 present between the zones 8 must be obtained by doping. Otherwise, this doping need not occur by diffusion but may take place in certain circumstances by ion implantation or in a different manner.

Figure 7:
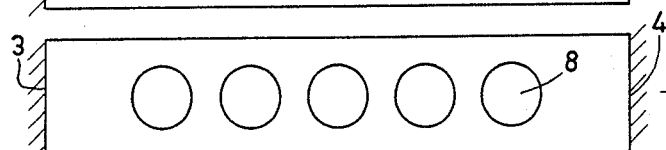
Figure 8:
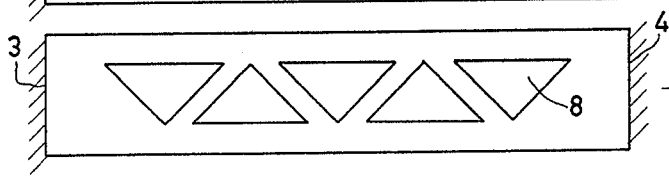

Finally it is to be noted that although in the examples the zones of the second conductivity type are square or rectangular in shape, this need in practice by no means always be the case and other zones having circular, triangular or other cross-sections may also be used, as shown, for example in FIGS. 7 and 8.

What is claimed is:

1. A semiconductor laser having a semiconductor body comprising a strip-shaped active region situated within a resonator, in which radiation is emitted in the longitudinal direction of the strip-shaped active region and in which a number of p-n-junctions are electrically connected in parallel to inject charge carriers into the active region, the strip-shaped active region forming part of an active semiconductor layer of a first conductivity type and having a plurality of spaced-apart zones of the second conductivity type within which radiation is generated, said zones being electrically connected to an electrode provided on a surface of the semiconductor body, that part of the active layer of the first conductivity type between the zones of the second conductivity type having a band spacing which is at least equal to that of the zones, and the largest dimension of said zones, viewed in the longitudinal direction of the strip-shaped active region, being at most equal to 20 $\mu$m, so that, upon ageing, crystal defects in any one of said zones will not extend beyond said zone.

2. A semiconductor laser as claimed in claim 1, characterized in that the largest dimension of the zones of the second conductivity type in the longitudinal direction of the active region is at most 10 $\mu$m.

3. A semiconductor laser as claimed in claim 1, characterized in that the mutual distance between the zones of the second conductivity type in the longitudinal direction of the active region is at least substantially equal to their largest dimension.

4. A semiconductor laser as claimed in claims 1, 2 or 3, characterized in that the zones of the second conductivity type, viewed in the longitudinal direction of the active region, are situated with their centers on a single straight line.

5. A semiconductor laser as claimed in claims 1, 2 or 3, characterized in that the zones of the second conductivity type, viewed in the longitudinal direction of the active region, are situated with their centers alternately on one of two parallel straight lines.

6. A semiconductor laser as claimed in claim 5, characterized in that the distance between the parallel lines is smaller than the dimension of the zones in the direction of width of the active region.

7. A semiconductor laser as claimed in claim 5, characterized in that the zones which are situated on one parallel line are connected to a first electrode and the zones which are situated on the other parallel line are connected to a second electrode.

8. A semiconductor laser as claimed in claims 1, 2 or 3, characterized in that the zones of the second conductivity type all have the same dimensions at least in the longitudinal direction of the active region.

9. A semiconductor laser as claimed in claims 1, 2 or 3, characterized in that the zones of the second conductivity type in the active layer form part of regions of the second conductivity type extending from the surface to at least partially through the thickness of the active layer.

10. A semiconductor laser as claimed in claim 9, characterized in that the zones of the second conductivity type extend through the entire thickness of the active layer.

11. A semiconductor laser as claimed in claims 1, 2 or 3, characterized in that the active layer is situated between two passive layers of the first conductivity type having a larger band spacing than that of the active layer.

12. A semiconductor laser as claimed in claims 1, 2 or 3, characterized in that the active layer comprises an n-type semiconductor material selected from the group consisting of gallium arsenide and gallium aluminum arsenide.

13. A semiconductor laser as claimed in claim 12, characterized in that the zones of the second conductivity type are formed by doping with zinc.

14. A semiconductor laser as claimed in claims 1, 2 or 3, characterized in that the resonator is formed by reflecting side faces of the semiconductor body, said side faces intersecting the active layer only in those portions of the active layer comprising material of the first conductivity type.

* * * * *